(12) United States Patent
Sen Gupta et al.

(10) Patent No.: US 11,444,205 B2
(45) Date of Patent: Sep. 13, 2022

(54) CONTACT STACKS TO REDUCE HYDROGEN IN THIN FILM TRANSISTOR

(71) Applicant: Intel Corporation, Santa Clara, CA (US)

(72) Inventors: Arnab Sen Gupta, Hillsboro, OR (US); Matthew Metz, Portland, OR (US); Benjamin Chu-Kung, Portland, OR (US); Abhishek Sharma, Hillsboro, OR (US); Van H. Le, Portland, OR (US); Miriam R. Reshotko, Portland, OR (US); Christopher J. Jezewski, Portland, OR (US); Ryan Arch, Hillsboro, OR (US); Ande Kitamura, Portland, OR (US); Jack T. Kavalieros, Portland, OR (US); Seung Hoon Sung, Portland, OR (US); Lawrence Wong, Beaverton, OR (US); Tahir Ghani, Portland, OR (US)

(73) Assignee: Intel Corporatiion, Santa Clara, CA (US)

( * ) Notice: Subject to any disclaimer, the term of this patent is extended or adjusted under 35 U.S.C. 154(b) by 841 days.

(21) Appl. No.: 16/143,001

(22) Filed: Sep. 26, 2018

(65) Prior Publication Data

US 2020/0098657 A1    Mar. 26, 2020

(51) Int. Cl.
| | | |
|---|---|---|
| H01L 29/786 | (2006.01) | |
| H01L 23/31 | (2006.01) | |
| H01L 29/45 | (2006.01) | |
| H01L 29/40 | (2006.01) | |
| H01L 29/66 | (2006.01) | |
| H01L 27/24 | (2006.01) | |
| H01L 27/108 | (2006.01) | |

(52) U.S. Cl.
CPC ...... *H01L 29/7869* (2013.01); *H01L 23/3171* (2013.01); *H01L 29/401* (2013.01); *H01L 29/45* (2013.01); *H01L 29/66742* (2013.01); *H01L 29/786* (2013.01); *H01L 27/10805* (2013.01); *H01L 27/2436* (2013.01)

(58) Field of Classification Search
CPC .......................... H01L 29/45; H01L 29/7869
See application file for complete search history.

(56) References Cited

U.S. PATENT DOCUMENTS

2017/0271517 A1* 9/2017 Kimura ................. H01L 21/324
2018/0277574 A1* 9/2018 Ochi ....................... H01L 29/45

* cited by examiner

*Primary Examiner* — Farun Lu
(74) *Attorney, Agent, or Firm* — Schwabe, Williamson & Wyatt, P.C.

(57) ABSTRACT

Embodiments herein describe techniques for a semiconductor device including a substrate and a transistor above the substrate. The transistor includes a channel layer above the substrate, a conductive contact stack above the substrate and in contact with the channel layer, and a gate electrode separated from the channel layer by a gate dielectric layer. The conductive contact stack may be a drain electrode or a source electrode. In detail, the conductive contact stack includes at least a metal layer, and at least a metal sealant layer to reduce hydrogen diffused into the channel layer through the conductive contact stack. Other embodiments may be described and/or claimed.

23 Claims, 7 Drawing Sheets

CONTACT STACKS TO REDUCE HYDROGEN IN THIN FILM TRANSISTOR

FIELD

Embodiments of the present disclosure generally relate to the field of integrated circuits, and more particularly, to transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays.

Hydrogen in a semiconductor device, e.g., a TFT, may cause various undesirable alterations that can change the doping, stability, and other properties of the semiconductor device. For example, hydrogen in a channel layer of a TFT may cause large threshold voltage of the transistor as well as unintentional doping.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1C:
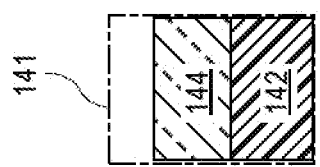
FIGS. 1(a)-1(e) schematically illustrate diagrams of a thin film transistor (TFT) including various contact stacks having a metal layer and a metal sealant layer, in accordance with some embodiments.

Thin-film transistors (TFT) have emerged as an attractive option to fuel Moore's law by integrating TFTs in the backend. TFTs may be fabricated in various architectures, e.g., a back-gated or bottom gate architecture, a top-gated architecture, or a vertical architecture. Hydrogen in a TFT may cause various undesirable alterations that can change the doping, stability, and other properties of the TFT. For example, hydrogen may diffuse through a contact of a TFT, e.g., a source electrode or a drain electrode, into a channel of the TFT to act as a dopant to the channel, which may make the TFT lose gate control.

Embodiments herein may include various conductive contact stacks to be used as a source electrode or a drain electrode, where the contact stacks may reduce hydrogen diffusion into the channel of a TFT. A conductive contact stack may be simply referred to as a contact stack. A contact stack may be a multi-layer stack including a metal sealant layer. In some embodiments, the metal sealant layer may break the continuity of grain boundaries of standard metal layers. A metal sealant layer in a multi-layer contact stack may prevent hydrogen exchange with a channel layer of a TFT, thus improving the short channel performance, gate control, and other properties of the TFT.

Embodiments herein may present a semiconductor device including a substrate and a transistor above the substrate. The transistor includes a channel layer above the substrate, a conductive contact stack above the substrate and in contact with the channel layer, and a gate electrode separated from the channel layer by a gate dielectric layer. The conductive contact stack may be a drain electrode or a source electrode. In detail, the conductive contact stack includes at least a metal layer, and at least a metal sealant layer to reduce hydrogen diffused into the channel layer through the conductive contact stack.

In embodiments, a method for forming a TFT includes forming a channel layer above a substrate, forming a conductive contact stack above the substrate and in contact with the channel layer, and forming a gate electrode separated from the channel layer by a gate dielectric layer. The conductive contact stack may be a drain electrode or a source electrode. In detail, the conductive contact stack includes at least a metal layer, and at least a metal sealant layer to reduce hydrogen diffused into the channel layer through the conductive contact stack.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell. The transistor in the memory cell may include a channel layer above a substrate; a source contact stack above the substrate, in contact with the channel layer, and coupled to a bit line of the memory array; a drain contact stack above the substrate, in contact with the channel layer, and coupled to a first electrode of the storage cell; and a gate electrode separated from the channel layer by a gate dielectric layer, and coupled to a word line of the memory array. The source contact stack or the drain contact stack includes at least a metal layer, and at least a metal sealant layer to reduce hydrogen diffused into the channel layer through the source contact stack or the drain contact stack. In addition, the storage cell may have a second electrode coupled to a source line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1(a)-1(e) schematically illustrate diagrams of a TFT 110 including various contact stacks, e.g., a contact stack 111, a contact stack 119, a contact stack 131, a contact stack 141, a contact stack 151, a contact stack 161, having a metal layer and a metal sealant layer, in accordance with some embodiments. For clarity, features of the TFT 110, the contact stack 111, the contact stack 119, the contact stack 131, the contact stack 141, the contact stack 151, and the contact stack 161, may be described below as examples for understanding an example TFT including a contact stack having a metal layer and a metal sealant layer. It is to be understood that there may be more or fewer components within a TFT, a contact stack, a metal layer, and a metal sealant layer. Further, it is to be understood that one or more of the components within a TFT, a contact stack, a metal layer, and a metal sealant layer, may include additional and/or varying features from the description below, and may include any device that one having ordinary skill in the art would consider and/or refer to as a TFT, a contact stack, a metal layer, and a metal sealant layer.

Figure 1E:
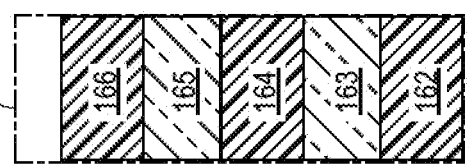

In embodiments, an IC 100 includes a substrate 101, an ILD layer 103 above the substrate 101, and the TFT 110 above the substrate 101 and the ILD layer 103. The TFT 110 includes a gate electrode 105 above the substrate 101, a gate dielectric layer 107, and a channel layer 109. The contact stack 111 and the contact stack 119 are in contact with the channel layer 109. The contact stack 111 or the contact stack 119 may be a drain electrode or a source electrode. A passivation layer 117 is adjacent to the channel layer 109, between the contact stack 111 and the contact stack 119. The gate electrode 105, the gate dielectric layer 107, the channel layer 109, the contact stack 111, and the contact stack 119 may be within an ILD layer 120. As shown in FIG. 1(a), the channel layer 109 is above the gate electrode 105, while the contact stack 111 and the contact stack 119 are above the channel layer 109.

In embodiments, the contact stack 111 or the contact stack 119 may include at least a metal layer, and at least a metal sealant layer to reduce hydrogen diffused into the channel layer 109 through the contact stack 111 or the contact stack 119. For example, the contact stack 111 includes a metal layer 112, a metal sealant layer 114, and a metal layer 116, where the metal layer 112 is adjacent to the channel layer 109. In some other embodiments, a metal sealant layer may be in direct contact with the channel layer.

In embodiments, the metal sealant layer 114 may include a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO. The metal sealant layer 14 may have a thickness in a range of about 1 Angstroms to 10 Angstroms.

FIGS. 1(b)-1(e) illustrates various contact stacks, e.g., the contact stack 131, the contact stack 141, the contact stack 151, and the contact stack 161, to be used in place of the contact stack 111 or the contact stack 119. The contact stack 131, the contact stack 141, the contact stack 151, or the contact stack 161 includes at least a metal layer, and at least a metal sealant layer to reduce hydrogen diffused into the channel layer through the contact stack.

Figure 1B:
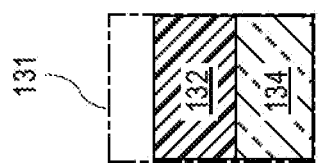

In embodiments, as shown in FIG. 1(b), the contact stack 131 includes only a metal layer 132 and a metal sealant layer 134, where the metal sealant layer 134 may be placed in direct contact with the channel layer 109.

In embodiments, as shown in FIG. 1(c), the contact stack 141 includes only a metal layer 142 and a metal sealant layer 144, where the metal layer 142 may be placed in direct contact with the channel layer 109.

Figure 1D:
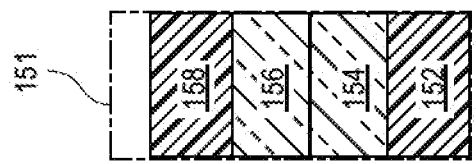
Figure 1A:
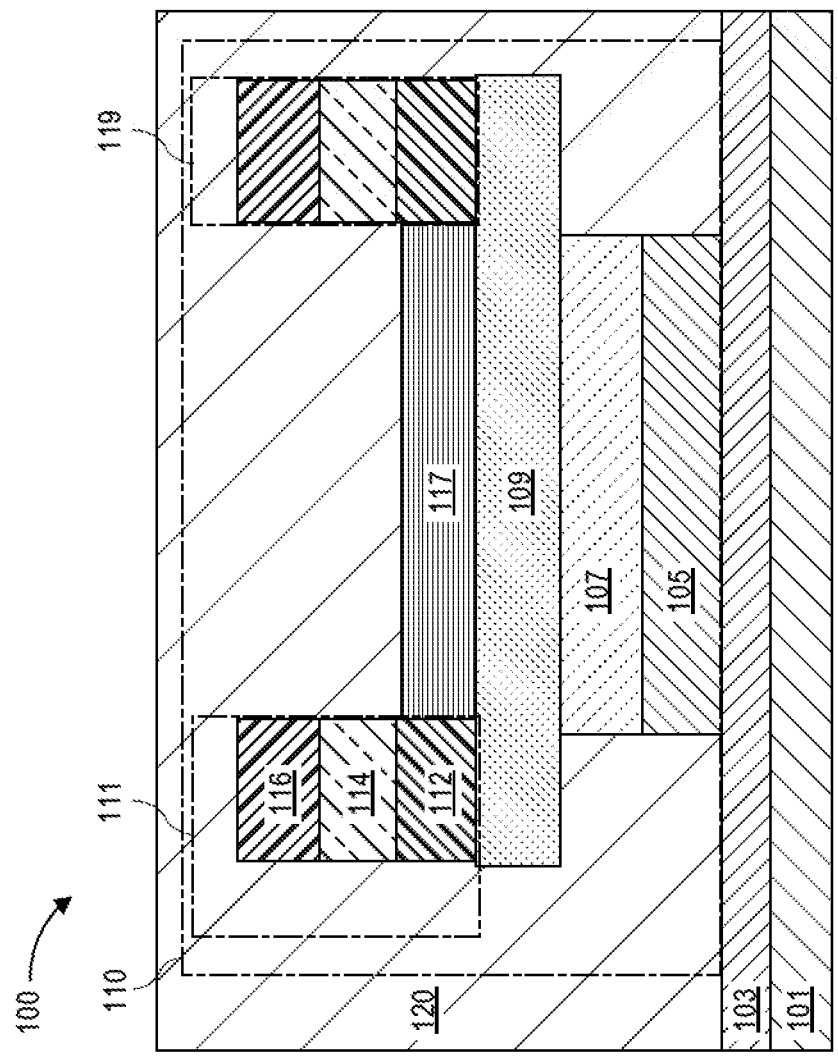

In embodiments, as shown in FIG. 1(d), the contact stack 151 includes multiple metal sealant sublayers, e.g., a metal sealant sublayer 154, and a metal sealant sublayer 156. The metal sealant sublayer 154, and the metal sealant sublayer 156 may be between a metal layer 152 and a metal layer 158.

In embodiments, as shown in FIG. 1(e), the contact stack 161 includes multiple metal sealant layers, e.g., a metal sealant layer 163, and a metal sealant layer 165, separated by one or more metal layers, e.g., a metal layer 162, a metal layer 164, and a metal layer 166. The contact stack 161 may be placed on the channel layer 109, where the metal layer 162 may be placed in direct contact with the channel layer 109. The metal layer 162 and the metal layer 164 may be a first metal layer and a second metal layer, where the first metal layer includes TiN and the second metal layer includes W, Ru, or Si; or the first metal layer includes Ru and the second metal layer includes W or Si; or the first metal layer includes Si and the second metal layer W or TiN.

In embodiments, the channel layer 109 may be a n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 120 may include silicon dioxide ($SiO_2$), carbon doped oxide (CDO), silicon nitride, perfluorocyclobutane, polytetrafluoroethylene, fluorinated silicate glass (FSG), organic polymer, siloxane, a porous dielectric material, or organosilicate glass. In some embodiments, the ILD layer 103 or the ILD layer 120 may include some low-k dielectric materials. Suitable dielectric materials may include carbon-doped silicon dioxide materials, organic polymeric thermoset materials, silicon oxycarbide; SiCOH dielectrics; fluorine doped silicon oxide; spin-on glasses, silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric material.

In embodiments, the gate dielectric layer 107 may include a high-K dielectric material selected from the group consisting of hafnium silicate, zirconium silicate, hafnium dioxide, zirconium dioxide, aluminum oxide, and nitride hafnium silicate.

In embodiments, the gate electrode 105, the metal layer 116, or the metal layer 112 of the contact stack 111, or the metal layers of the contact stack 119, the contact stack 131, the contact stack 141, the contact stack 151, and the contact stack 161, may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Figure 2:
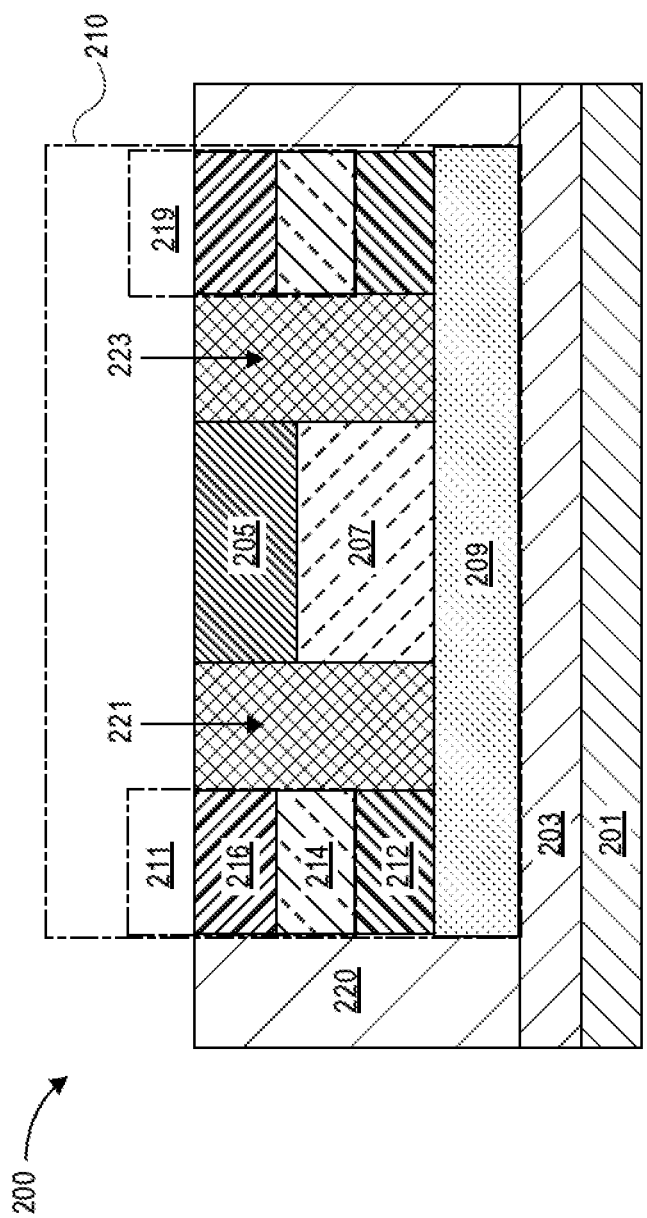
FIG. 2 schematically illustrates another diagram of a TFT including a contact stack having a metal layer and a metal sealant layer, in accordance with some embodiments.

FIG. 2 schematically illustrates another diagram of a TFT 210 including a contact stack 211 having a metal layer and a metal sealant layer, in accordance with some embodiments. The TFT 210 and the contact stack 211 may be similar to the TFT 110 and the contact stack 111, as shown in FIG. 1.

In embodiments, an IC 200 includes a substrate 201, an ILD layer 203 above the substrate 201, and the TFT 210 above the substrate 201 and the ILD layer 203. The TFT 210 includes a gate electrode 205 above the substrate 101, a gate dielectric layer 207, and a channel layer 209. The gate dielectric layer 207 is above the channel layer 209, the gate electrode 205 is above the gate dielectric layer 207. The contact stack 211 and a contact stack 219 are in contact with the channel layer 209. The contact stack 211 or the contact stack 219 may be a drain electrode or a source electrode, separated by a spacer 221 or a spacer 223 from the gate electrode 205. The gate electrode 205, the gate dielectric layer 207, the channel layer 209, the contact stack 211, the contact stack 219, the spacer 221, and the spacer 223 may be within an ILD layer 220.

In embodiments, the contact stack 211 or the contact stack 219 may include at least a metal layer, and at least a metal sealant layer to reduce hydrogen diffused into the channel layer 209 through the contact stack 211 or the contact stack 219. For example, the contact stack 211 includes a metal layer 212, a metal sealant layer 214, and a metal layer 216, where the metal layer 212 is adjacent to the channel layer 209. In some other embodiments, a metal sealant layer may be in direct contact with the channel layer.

Figure 3:
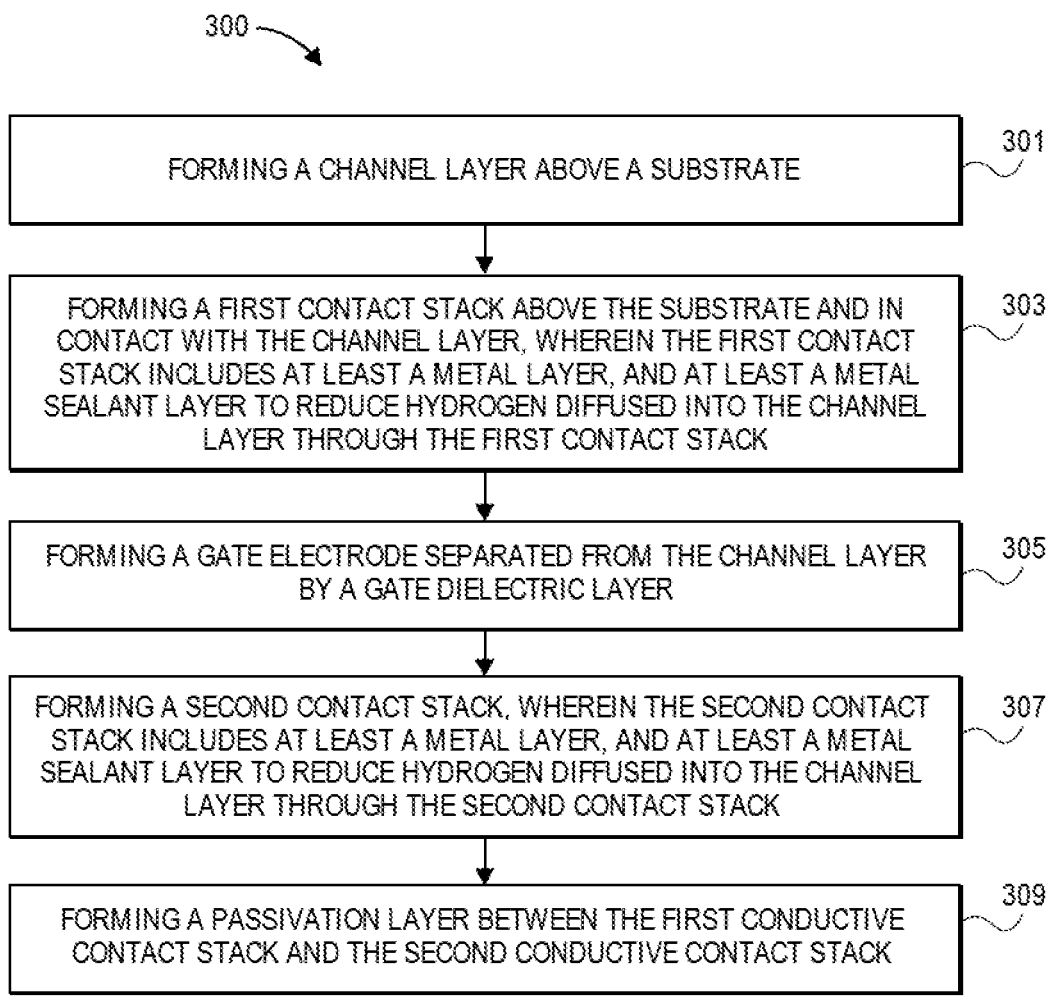
FIG. 3 illustrates a diagram of a process for forming a TFT including a contact stack having a metal layer and a metal sealant layer, in accordance with some embodiments FIG. 4 schematically illustrates a diagram of TFT including a contact stack having a metal layer and a metal sealant layer and formed in back-end-of-line (BEOL) on a substrate, in accordance with some embodiments.

FIG. 3 illustrates a diagram of a process 300 for forming a TFT including a contact stack having a metal layer and a metal sealant layer, in accordance with some embodiments. In embodiments, the process 300 may be applied to form the TFT 110 having a metal layer and a metal sealant layer, as shown in FIG. 1; or the TFT 210 having a metal layer and a metal sealant layer, as shown in FIG. 2.

At block 301, the process 300 may include forming a channel layer above a substrate. For example, the process 300 may include forming the channel layer 109 above the substrate 101 as shown in FIG. 1.

At block 303, the process 300 may include forming a first contact stack above the substrate and in contact with the channel layer, where the first contact stack includes at least a metal layer, and at least a metal sealant layer to reduce hydrogen diffused into the channel layer through the first contact stack. For example, the process 300 may include forming the contact stack 111 above the substrate 101 and in contact with the channel layer 109. The contact stack 111 is a drain electrode or a source electrode, includes at least the metal layer 112, and at least the metal sealant layer 114 to reduce hydrogen diffused into the channel layer 109 through the contact stack 111 as shown in FIG. 1.

At block 305, the process 300 may include forming a gate electrode separated from the channel layer by a gate dielectric layer. For example, the process 300 may include forming the gate electrode 105 separated from the channel layer 109 by the gate dielectric layer 107 as shown in FIG. 1.

At block 307, the process 300 may include forming a second contact stack, wherein the second contact stack includes at least a metal layer, and at least a metal sealant layer to reduce hydrogen diffused into the channel layer through the second contact stack. For example, the process 300 may include forming the contact stack 119, wherein the contact stack 119 includes at least a metal layer, and at least a metal sealant layer to reduce hydrogen diffused into the channel layer through the contact stack 119 as shown in FIG. 1.

At block 309, the process 300 may include forming a passivation layer between the first contact stack and the second contact stack. For example, the process 300 may include forming the passivation layer 117 between the contact stack 111 and the contact stack 119 as shown in FIG. 1.

In addition, the process 300 may include additional operations to form other layers, e.g., ILD layers, encapsulation layers, insulation layers, not shown.

Figure 4:
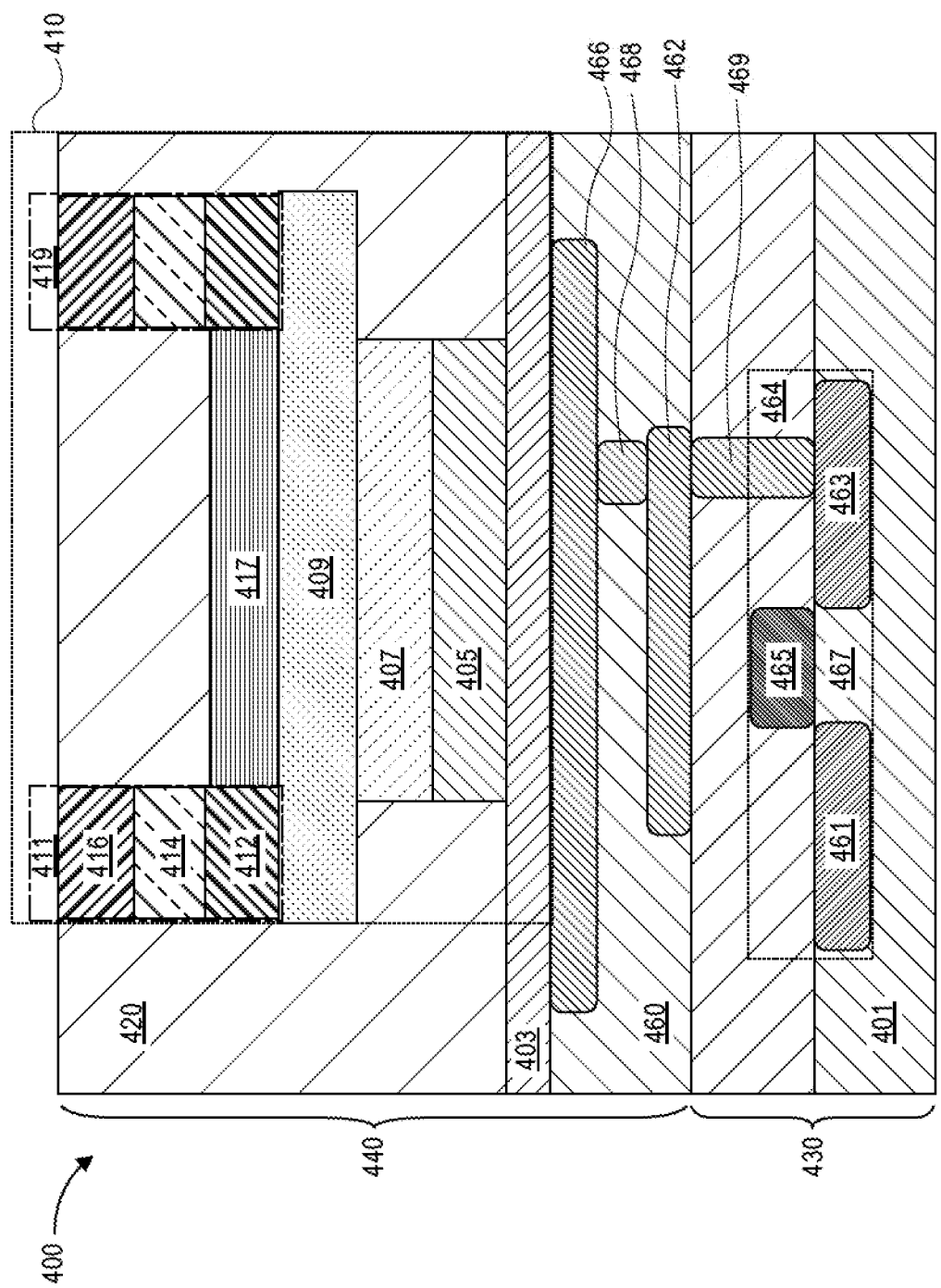

FIG. 4 schematically illustrates a diagram of TFT 410 including a contact stack 411 having a metal layer and a metal sealant layer and formed in back-end-of-line (BEOL) on a substrate, in accordance with some embodiments. The TFT 410 may be an example of the TFT 110 in FIG. 1, or the TFT 210 in FIG. 2. Various layers in the TFT 410 may be similar to corresponding layers in the TFT 110 in FIG. 1, or the TFT 210 in FIG. 2.

In embodiments, an IC 400 includes the substrate 401, an ILD layer 403 above the substrate 401, and the TFT 410 above the substrate 401 and the ILD layer 403. The TFT 410 includes a gate electrode 405 above the substrate 401, a gate dielectric layer 407, and a channel layer 409. The gate dielectric layer 407 is above the gate electrode 405, the channel layer 409 is above the gate dielectric layer 407. The contact stack 411 and a contact stack 419 are in contact with the channel layer 409. The contact stack 411 or the contact stack 419 may be a drain electrode or a source electrode, separated by a passivation layer 417. The contact stack 411 includes a metal layer 412, a metal sealant layer 414, and another metal layer 416. The gate electrode 405, the gate dielectric layer 407, the channel layer 409, the contact stack 411, the contact stack 419, the passivation layer 417 may be within an ILD layer 420.

In embodiments, the vertical TFT 410 may be formed at the BEOL 440. In addition to the TFT 410, the BEOL 440 may further include a dielectric layer 460. One or more vias, e.g., a via 468, may be connected to one or more interconnect, e.g., an interconnect 466, and an interconnect 462 within the dielectric layer 460. In embodiments, the interconnect 466 and the interconnect 462 may be of different metal layers at the BEOL 440. The dielectric layer 460 is shown for example only. Although not shown by FIG. 4, in various embodiments there may be multiple dielectric layers included in the BEOL 440.

In embodiments, the BEOL 440 may be formed on the front-end-of-line (FEOL) 430. The FEOL 430 may include the substrate 401. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465. Furthermore, the transistor 464 may be coupled to interconnects, e.g., the interconnect 462, through a via 469.

Figure 5:
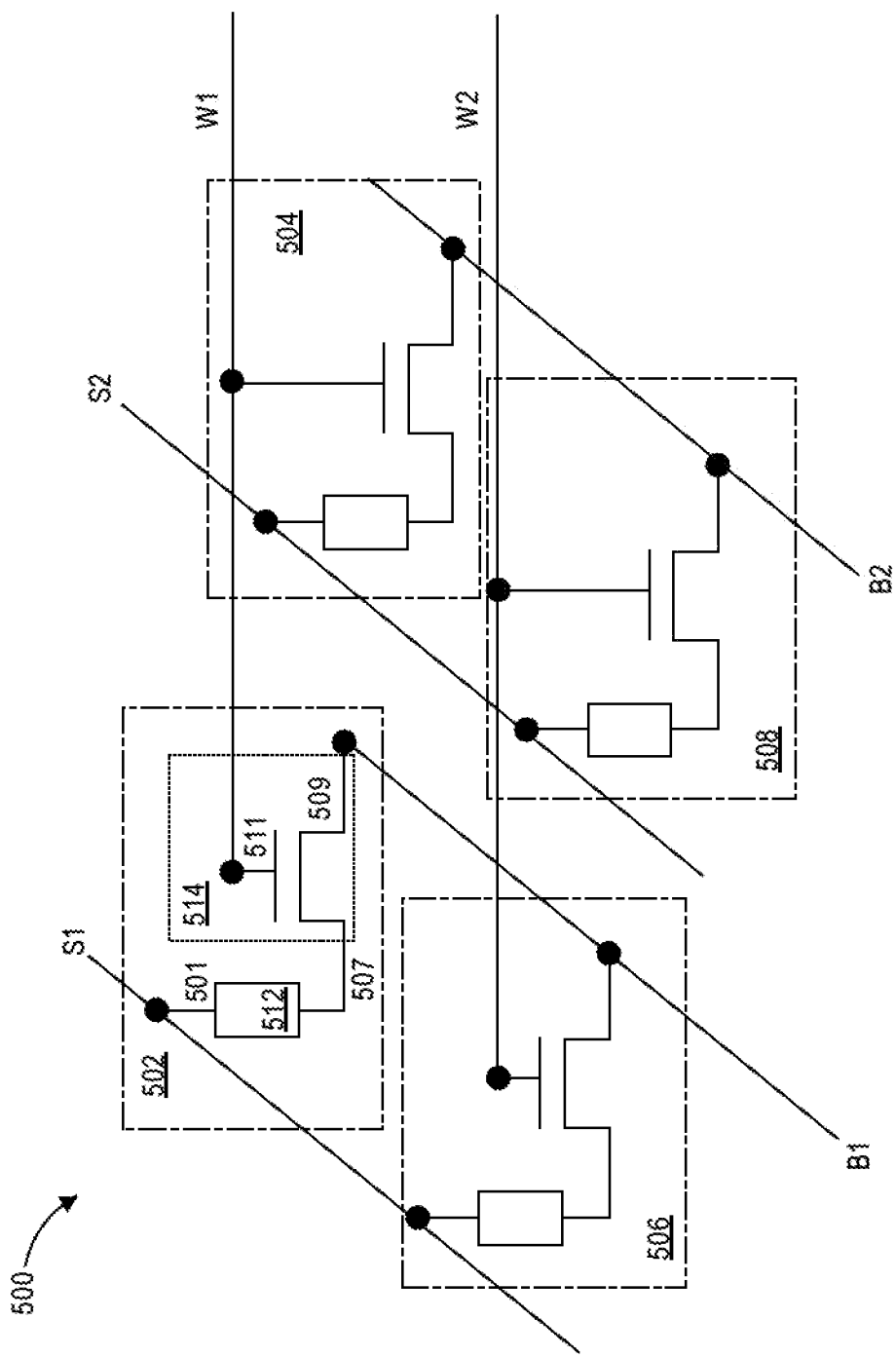
FIG. 5 schematically illustrates a memory array with multiple memory cells, where a TFT may be a selector of a memory cell, in accordance with some embodiments.

FIG. 5 schematically illustrates a memory array 500 with multiple memory cells (e.g., a memory cell 502, a memory cell 504, a memory cell 506, and a memory cell 508), where a TFT, e.g., a TFT 514, may be a selector of a memory cell, e.g., the memory cell 502, in accordance with various embodiments. In embodiments, the TFT 514 may be an example of the TFT 110 in FIG. 1, the TFT 210 in FIG. 2, or the TFT 410 in FIG. 4. The TFT 514 may include a gate electrode 511 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 502 may be coupled in series with the other memory cells of the same row, and may be coupled in parallel with the memory cells of the other rows. The memory array 500 may include any suitable number of one or more memory cells.

In embodiments, multiple memory cells, such as the memory cell 502, the memory cell 504, the memory cell 506, and the memory cell 508, may have a similar configuration. For example, the memory cell 502 may include the TFT 514 coupled to a storage cell 512 that may be a capacitor, which may be called a 1T1C configuration. The memory cell 502 may be controlled through multiple electrical connections to read from the memory cell, write to the memory cell, and/or perform other memory operations. In some embodiments, the storage cell 512 may be another type of storage device, e.g., a resistive random access memory (RRAM) cell.

The TFT 514 may be a selector for the memory cell 502. A word line W1 of the memory array 500 may be coupled to a gate electrode 511 of the TFT 514. When the word line W1 is active, the TFT 514 may select the storage cell 512. A source line S1 of the memory array 500 may be coupled to an electrode 501 of the storage cell 512, while another electrode 507 of the storage cell 512 may be shared with the TFT 514. In addition, a bit line B1 of the memory array 500 may be coupled to another electrode, e.g., an electrode 509 of the TFT 514. The shared electrode 507 may be a source electrode or a drain electrode of the TFT 514, while the electrode 509 may be a drain electrode or a source electrode of the TFT 514. A drain electrode and a source electrode may be used interchangeably herein. Additionally, a source line and a bit line may be used interchangeably herein.

In various embodiments, the memory cells and the transistors, e.g., the memory cell 502 and the TFT 514, included in the memory array 500 may be formed in BEOL, as shown in FIG. 4. For example, the TFT 514 may be illustrated as the vertical TFT 410 shown in FIG. 4 at the BEOL.

Accordingly, the memory array 500 may be formed in higher metal layers, e.g., metal layer 3 and/or metal layer 4, of the integrated circuit above the active substrate region, and may not occupy the active substrate area that is occupied by conventional transistors or memory devices.

Figure 6:
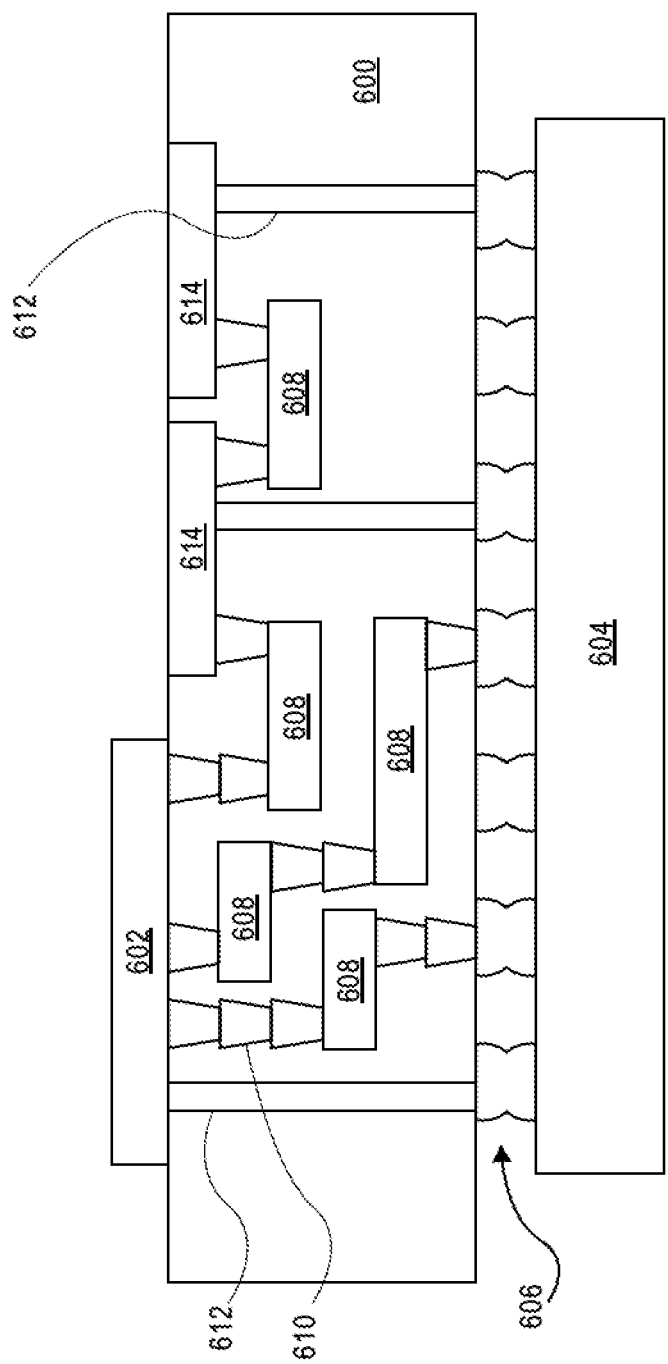
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a TFT, e.g., the TFT 110 in FIG. 1, the TFT 210 in FIG. 2, or the TFT 410 in FIG. 4. The second substrate 604 may be, for instance, a memory module, a computer motherboard, or another integrated circuit die. For example, the second substrate 604 may be a memory module including the memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
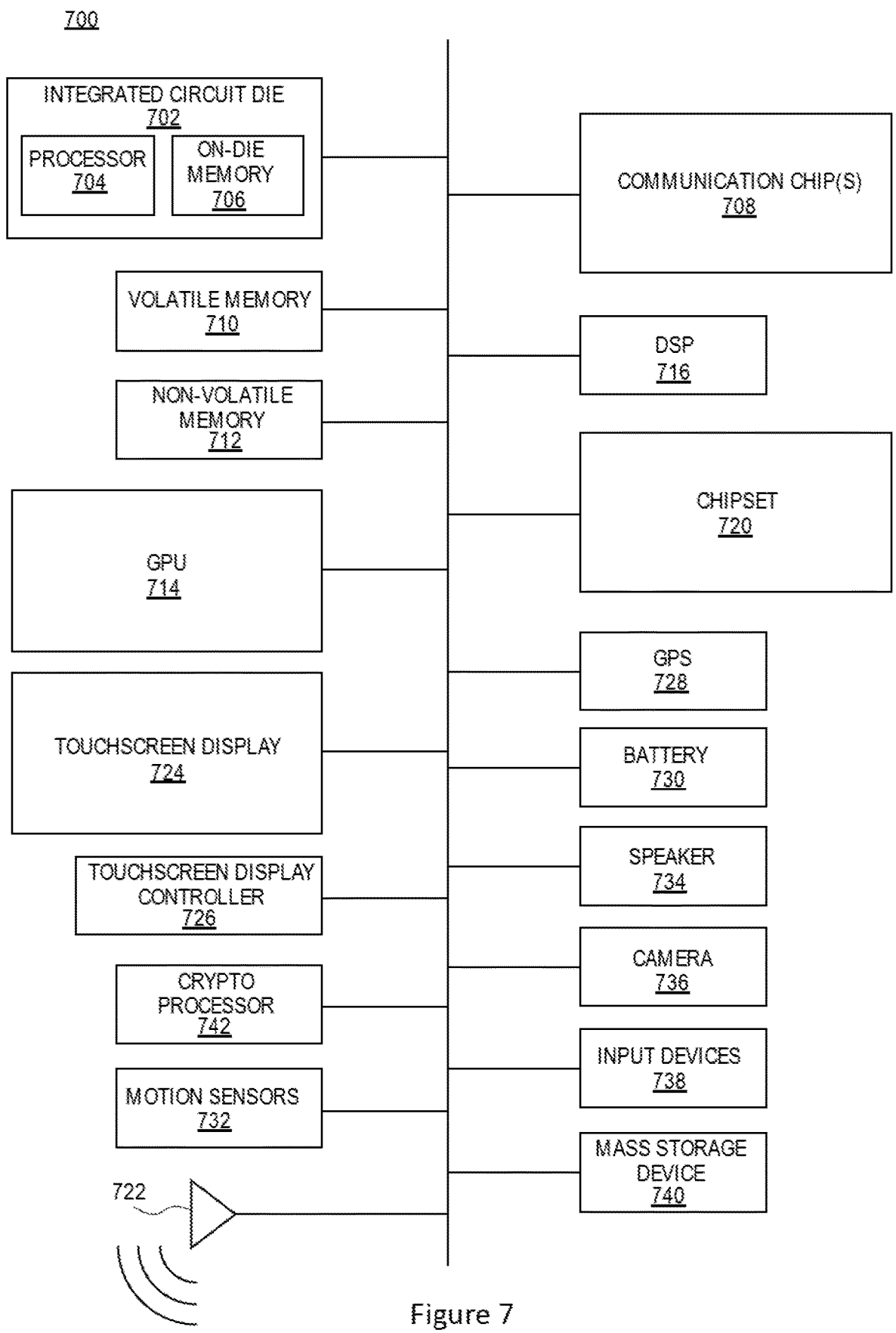
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the TFT 110 in FIG. 1, the TFT 210 in FIG. 2, or the TFT 410 in FIG. 4, or a TFT formed according to the process 300 shown in FIG. 3.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (µLED) display, or others. For example, the touchscreen display 724 may include the TFT 110 in FIG. 1, the TFT 210 in FIG. 2, or the TFT 410 in FIG. 4, or a TFT formed according to the process 300 shown in FIG. 3.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the TFT 110 in FIG. 1, the TFT 210 in FIG. 2, or the TFT 410 in FIG. 4, or a TFT formed according to the process 300 shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some Non-Limiting Examples are Provided Below.

Example 1 may include a semiconductor device, comprising: a substrate; a transistor above the substrate, wherein the transistor includes: a channel layer above the substrate; a conductive contact stack above the substrate and in contact with the channel layer, wherein the conductive contact stack is a drain electrode or a source electrode, and the conductive contact stack includes at least a metal layer, and at least a metal sealant layer to reduce hydrogen diffused into the channel layer through the conductive contact stack; and a gate electrode separated from the channel layer by a gate dielectric layer.

Example 2 may include the semiconductor device of example 1 and/or some other examples herein, wherein the metal sealant layer is in direct contact with the channel layer.

Example 3 may include the semiconductor device of example 1 and/or some other examples herein, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

Example 4 may include the semiconductor device of example 1 and/or some other examples herein, wherein the metal sealant layer has a thickness in a range of about 1 Angstroms to 10 Angstroms.

Example 5 may include the semiconductor device of example 1 and/or some other examples herein, wherein the channel layer is above the gate electrode, and the conductive contact stack is above the channel layer.

Example 6 may include the semiconductor device of example 1 and/or some other examples herein, wherein the gate dielectric layer is above the channel layer, the gate electrode is above the gate dielectric layer, the conductive contact stack is above the channel layer, and the conductive contact stack is separated from the gate electrode by a spacer.

Example 7 may include the semiconductor device of example 1 and/or some other examples herein, wherein the conductive contact stack includes multiple metal sealant layers separated by one or more metal layers.

Example 8 may include the semiconductor device of example 1 and/or some other examples herein, wherein the metal sealant layer in the conductive contact stack includes multiple metal sealant sublayers.

Example 9 may include the semiconductor device of example 1 and/or some other examples herein, wherein the conductive contact stack includes at least a first metal layer and a second metal layer, the first metal layer includes TiN and the second metal layer includes W, Ru, or Si; or the first metal layer includes Ru and the second metal layer includes W or Si; or the first metal layer includes Si and the second metal layer W or TiN.

Example 10 may include the semiconductor device of example 1 and/or some other examples herein, wherein the conductive contact stack is a first conductive contact stack as the source electrode, and the transistor further includes: a second conductive contact stack as the drain electrode, wherein the second conductive contact stack includes at least a metal layer, and at least a metal sealant layer to reduce hydrogen diffused into the channel layer through the second conductive contact stack; and a passivation layer between the first conductive contact stack and the second conductive contact stack.

Example 11 may include the semiconductor device of example 1 and/or some other examples herein, further comprising: the gate dielectric layer between the channel layer and the gate electrode, wherein the gate dielectric layer includes a material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

Example 12 may include the semiconductor device of example 1 and/or some other examples herein, wherein the channel layer includes a material selected from the group consisting of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 13 may include the semiconductor device of example 1 and/or some other examples herein, wherein the gate electrode or the metal layer of the conductive contact stack includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 14 may include the semiconductor device of example 1 and/or some other examples herein, wherein the substrate includes a silicon substrate, a glass substrate, a metal substrate, or a plastic substrate.

Example 15 may include the semiconductor device of example 1 and/or some other examples herein, wherein the transistor is within an interconnect structure that is above the substrate.

Example 16 may include a method for forming a thin film transistor (TFT), the method comprising: forming a channel layer above a substrate; forming a conductive contact stack above the substrate and in contact with the channel layer, wherein the conductive contact stack is a drain electrode or a source electrode, and the conductive contact stack includes at least a metal layer, and at least a metal sealant layer to reduce hydrogen diffused into the channel layer through the conductive contact stack; and forming a gate electrode separated from the channel layer by a gate dielectric layer.

Example 17 may include the method of example 16 and/or some other examples herein, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

Example 18 may include the method of example 16 and/or some other examples herein, wherein the conductive contact stack is a first conductive contact stack as the source electrode, and the method further includes: forming a second conductive contact stack as the drain electrode, wherein the second conductive contact stack includes at least a metal layer, and at least a metal sealant layer to reduce hydrogen diffused into the channel layer through the second conductive contact stack; and forming a passivation layer between the first conductive contact stack and the second conductive contact stack.

Example 19 may include the method of example 16 and/or some other examples herein, wherein the channel layer is above the gate electrode, and the conductive contact stack is above the channel layer.

Example 20 may include the method of example 16 and/or some other examples herein, wherein the gate dielectric layer is above the channel layer, the gate electrode is above the gate dielectric layer, the conductive contact stack is above the channel layer, and the conductive contact stack is separated from the gate electrode by a spacer.

Example 21 may include the method of example 16 and/or some other examples herein, wherein the conductive contact stack includes multiple metal sealant layers separated by one or more metal layers.

Example 22 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a channel layer above a substrate; a source contact stack above the substrate, in contact with the channel layer, and coupled to a bit line of the memory array, wherein the source contact stack includes at least a metal layer, and at least a metal sealant layer to reduce hydrogen diffused into the channel layer through the source contact stack; a drain contact stack above the substrate, in contact with the channel layer, and coupled to a first electrode of the storage cell, wherein the drain contact stack includes at least a metal layer, and at least a metal sealant layer to reduce hydrogen diffused into the channel layer through the drain contact stack; and a gate electrode separated from the channel layer by a gate dielectric layer, and coupled to a word line of the memory array; and the storage cell further includes a second electrode coupled to a source line of the memory array.

Example 23 may include computing device of example 22 and/or some other examples herein, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

Example 24 may include computing device of example 22 and/or some other examples herein, wherein the metal sealant layer in the source contact stack or the drain contact stack includes multiple metal sealant sublayers.

Example 25 may include computing device of example 22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a substrate;
a transistor above the substrate, wherein the transistor includes:
  a channel layer above the substrate;
  a conductive contact stack above the substrate and in contact with the channel layer, wherein the conductive contact stack is a drain electrode or a source electrode, and the conductive contact stack includes at least a metal layer, and at least a metal sealant layer to reduce hydrogen diffused into the channel layer through the conductive contact stack, the metal selant layer over the metal layer; and a gate electrode separated from the channel layer by a gate dielectric layer.

2. The semiconductor device of claim 1, wherein the metal sealant layer is in direct contact with the channel layer.

3. The semiconductor device of claim 1, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

4. The semiconductor device of claim 1, wherein the metal sealant layer has a thickness in a range of about 1 Angstroms to 10 Angstroms.

5. The semiconductor device of claim 1, wherein the channel layer is above the gate electrode, and the conductive contact stack is above the channel layer.

6. The semiconductor device of claim 1, wherein the gate dielectric layer is above the channel layer, the gate electrode is above the gate dielectric layer, the conductive contact stack is above the channel layer, and the conductive contact stack is separated from the gate electrode by a spacer.

7. The semiconductor device of claim 1, wherein the conductive contact stack includes multiple metal sealant layers separated by one or more metal layers.

8. The semiconductor device of claim 1, wherein the metal sealant layer in the conductive contact stack includes multiple metal sealant sublayers.

9. The semiconductor device of claim 1, wherein the conductive contact stack includes at least a first metal layer and a second metal layer, the first metal layer includes TiN and the second metal layer includes W, Ru, or Si; or the first metal layer includes Ru and the second metal layer includes W or Si; or the first metal layer includes Si and the second metal layer W or TiN.

10. The semiconductor device of claim 1, wherein the conductive contact stack is a first conductive contact stack as the source electrode, and the transistor further includes:

a second conductive contact stack as the drain electrode, wherein the second conductive contact stack includes at least a metal layer, and at least a metal sealant layer to reduce hydrogen diffused into the channel layer through the second conductive contact stack; and a passivation layer between the first conductive contact stack and the second conductive contact stack.

11. The semiconductor device of claim 1, further comprising:

the gate dielectric layer between the channel layer and the gate electrode, wherein the gate dielectric layer includes a material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

12. The semiconductor device of claim 1, wherein the channel layer includes a material selected from the group consisting of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

13. The semiconductor device of claim 1, wherein the gate electrode or the metal layer of the conductive contact stack includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

14. The semiconductor device of claim 1, wherein the substrate includes a silicon substrate, a glass substrate, a metal substrate, or a plastic substrate.

15. The semiconductor device of claim 1, wherein the transistor is within an interconnect structure that is above the substrate.

16. A method for forming a thin film transistor (TFT), the method comprising:

forming a channel layer above a substrate;

forming a conductive contact stack above the substrate and in contact with the channel layer, wherein the conductive contact stack is a drain electrode or a source electrode, and the conductive contact stack includes at least a metal layer, and at least a metal sealant layer to reduce hydrogen diffused into the channel layer through the conductive contact stack, the metal selant layer over the metal layer; and forming a gate electrode separated from the channel layer by a gate dielectric layer.

17. The method of claim 16, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

18. The method of claim 16, wherein the conductive contact stack is a first conductive contact stack as the source electrode, and the method further includes:

forming a second conductive contact stack as the drain electrode, wherein the second conductive contact stack includes at least a metal layer, and at least a metal sealant layer to reduce hydrogen diffused into the channel layer through the second conductive contact stack; and forming a passivation layer between the first conductive contact stack and the second conductive contact stack.

19. The method of claim 16, wherein the channel layer is above the gate electrode, and the conductive contact stack is above the channel layer.

20. The method of claim 16, wherein the gate dielectric layer is above the channel layer, the gate electrode is above the gate dielectric layer, the conductive contact stack is above the channel layer, and the conductive contact stack is separated from the gate electrode by a spacer.

21. The method of claim 16, wherein the conductive contact stack includes multiple metal sealant layers separated by one or more metal layers.

22. A semiconductor device, comprising:

a substrate;

a transistor above the substrate, wherein the transistor includes:

a channel layer above the substrate;
a conductive contact stack above the substrate and in contact with the channel layer, wherein the conductive contact stack is a drain electrode or a source electrode, and the conductive contact stack includes at least a metal layer, and at least a metal sealant layer to reduce hydrogen diffused into the channel layer through the conductive contact stack, wherein the conductive contact stack includes multiple metal sealant layers separated by one or more metal layers; and
a gate electrode separated from the channel layer by a gate dielectric layer.

23. A semiconductor device, comprising:
a substrate;
a transistor above the substrate, wherein the transistor includes:
a channel layer above the substrate;
a conductive contact stack above the substrate and in contact with the channel layer, wherein the conductive contact stack is a drain electrode or a source electrode, and the conductive contact stack includes at least a metal layer, and at least a metal sealant layer to reduce hydrogen diffused into the channel layer through the conductive contact stack, wherein the conductive contact stack includes at least a first metal layer and a second metal layer, the first metal layer includes TiN and the second metal layer includes W, Ru, or Si; or the first metal layer includes Ru and the second metal layer includes W or Si; or the first metal layer includes Si and the second metal layer W or TiN; and
a gate electrode separated from the channel layer by a gate dielectric layer.

* * * * *